(12) United States Patent
Han et al.

(10) Patent No.: US 8,994,025 B2
(45) Date of Patent: Mar. 31, 2015

(54) VISIBLE RAY SENSOR AND LIGHT SENSOR INCLUDING THE SAME

(75) Inventors: Sang-Youn Han, Seoul (KR); Jun-Ho Song, Seongnam-si (KR); Kyung-Sook Jeon, Yongin-si (KR); Mi-Seon Seo, Seoul (KR); Sung-Hoon Yang, Seoul (KR); Suk-Won Jung, Goyang-si (KR); Seung Mi Seo, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 184 days.

(21) Appl. No.: 12/929,064

(22) Filed: Dec. 28, 2010

(65) Prior Publication Data
US 2012/0032169 A1  Feb. 9, 2012

(30) Foreign Application Priority Data
Aug. 9, 2010  (KR) .................. 10-2010-0076617

(51) Int. Cl.
| H01L 29/10 | (2006.01) |
| H01L 31/112 | (2006.01) |
| G02F 1/133 | (2006.01) |
| H01L 31/0376 | (2006.01) |

(52) U.S. Cl.
CPC ........ *H01L 31/1129* (2013.01); *G02F 1/13318* (2013.01); *H01L 31/03762* (2013.01); *Y02E 10/548* (2013.01)
USPC ............... 257/67; 257/53; 257/347; 257/411; 438/149; 438/152

(58) Field of Classification Search
CPC . H01L 31/03762; H01L 29/10; A01B 12/006
USPC ........... 250/208.1, 332; 257/53–67, 347, 411, 257/461; 345/173; 438/70, 149, 152, 479, 438/517
See application file for complete search history.

(56) References Cited

U.S. PATENT DOCUMENTS

| 8,319,307 | B1* | 11/2012 | Williams ....................... 257/461 |
| 2001/0030324 | A1* | 10/2001 | Morikawa et al. .............. 257/59 |
| 2001/0052597 | A1* | 12/2001 | Young et al. .................... 257/59 |
| 2002/0093053 | A1* | 7/2002 | Chan et al. ..................... 257/347 |
| 2005/0199967 | A1* | 9/2005 | Hoffman ....................... 257/411 |
| 2006/0275944 | A1* | 12/2006 | Hyun .............................. 438/70 |
| 2007/0063126 | A1* | 3/2007 | Lee .............................. 250/208.1 |
| 2008/0211781 | A1* | 9/2008 | Yamamoto .................... 345/173 |
| 2011/0266441 | A1* | 11/2011 | Fagan et al. ................... 250/332 |

FOREIGN PATENT DOCUMENTS

| JP | 2001-077342 | 3/2001 |
| JP | 2003-037261 | 2/2003 |
| JP | 2006-216601 | 8/2006 |

(Continued)

*Primary Examiner* — Kenneth Parker
*Assistant Examiner* — Fang-Xing Jiang
(74) *Attorney, Agent, or Firm* — H.C. Park & Associates, PLC

(57) ABSTRACT

The present invention relates to a visible ray sensor and a light sensor capable of improving photosensitivity by preventing photodegradation. The visible ray sensor may include: a substrate, a light blocking member formed on the substrate, and a visible ray sensing thin film transistor formed on the light blocking member. The light blocking member may be made of a transparent electrode, a band pass filter, or an opaque metal.

8 Claims, 12 Drawing Sheets

(56) References Cited

FOREIGN PATENT DOCUMENTS

| JP | 2007-180423 | 7/2007 |
| JP | 2010-056303 | 3/2010 |
| KR | 20000038215 | 7/2000 |
| KR | 20040081885 | 9/2004 |
| KR | 20090058743 | 6/2009 |

* cited by examiner

VISIBLE RAY SENSOR AND LIGHT SENSOR INCLUDING THE SAME

CROSS REFERENCE TO RELATED APPLICATION

This application claims priority from and the benefit of Korean Patent Application No. 10-2010-0076617 filed on Aug. 9, 2010, which is hereby incorporated by reference for all purposes as if fully set forth herein.

BACKGROUND OF THE INVENTION

1. Field of the Invention

Exemplary embodiments of the present invention relate to a visible ray sensor and a light sensor including the same. More particularly, exemplary embodiments of the present invention relate to a visible ray sensor and a light sensor capable of improving photosensitivity by preventing photodegradation.

2. Discussion of the Background

Liquid crystal displays (LCDs) are one of the most widely-used flat panel displays. An LCD may include a pair of panels provided with field-generating electrodes and a liquid crystal (LC) layer interposed between the two panels. The LCD may display images by applying signals to the field-generating electrodes to generate an electric field in the LC layer that determines the orientation of LC molecules therein to adjust polarization of incident light.

Recently, research on LCDs additionally having a touch sensing function or an image sensing function has been undertaken. To realize the touch sensing function and the image sensing function, a light sensor including an infrared ray sensor and a visible ray sensor may be added to the liquid crystal display.

Light sensors in a LCD may be exposed for a long time while sensing incident light. The semiconductor layer used as the light sensor may be exposed such that a dangling bond is formed. This results in the recombination of holes and electrons and the emission of heat. Accordingly, charge carriers may decrease and the electrical conductivity may deteriorate resulting in decreased photosensitivity. This problem is further described with reference to the accompanying drawings.

FIG. 1 is a graph showing a photocurrent behavior according to exposure time for a conventional visible ray sensor. FIG. 2 is a view comparing a region of an LCD exposed to light and a region that is not exposed to light in the conventional visible ray sensor.

As can be appreciated from FIG. 1, photocurrent gradually decreases as the exposure time increases. Thus, if the visible ray sensor is exposed for a long time, the electrical conductivity may deteriorate such that the photosensitivity also deteriorates.

Accordingly, the amount of the photocurrent generated in a region where the light is irradiated and a region where the light is not irradiated may differ, thereby resulting in the appearance of stains in the LCD.

The above information disclosed in this Background section is only for enhancement of understanding of the background of the invention and therefore it may contain information that does not form the prior art that is already known to a person of ordinary skill in the art.

SUMMARY OF THE INVENTION

Exemplary embodiments of the present invention provide a visible ray sensor capable of preventing photodegradation, and a light sensor including the same.

Exemplary embodiments of the present invention also provide a visible ray sensor to control the generation of photocurrent in an infrared ray sensor and the visible ray sensor by forming a dual gate electrode, and a light sensor including the same.

Further, exemplary embodiments of the present invention provide a visible ray sensor and a light sensor including the same of which constituent elements thereof are capable of being manufactured without additional processes.

Additional features of the exemplary embodiments will be set forth in the description which follows, and in part will be apparent from the description, or may be learned by practice of the invention.

Exemplary embodiments of the invention disclose a visible ray sensor including a substrate, a light blocking member disposed on the substrate, and a visible ray sensing thin film transistor disposed on the light blocking member.

Exemplary embodiments of the present invention also disclose a light sensor is including a substrate, a first light blocking member and a second light blocking member disposed on the substrate, a visible ray sensing thin film transistor formed on the first light blocking member, and an infrared ray sensing thin film transistor formed on the second light blocking member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
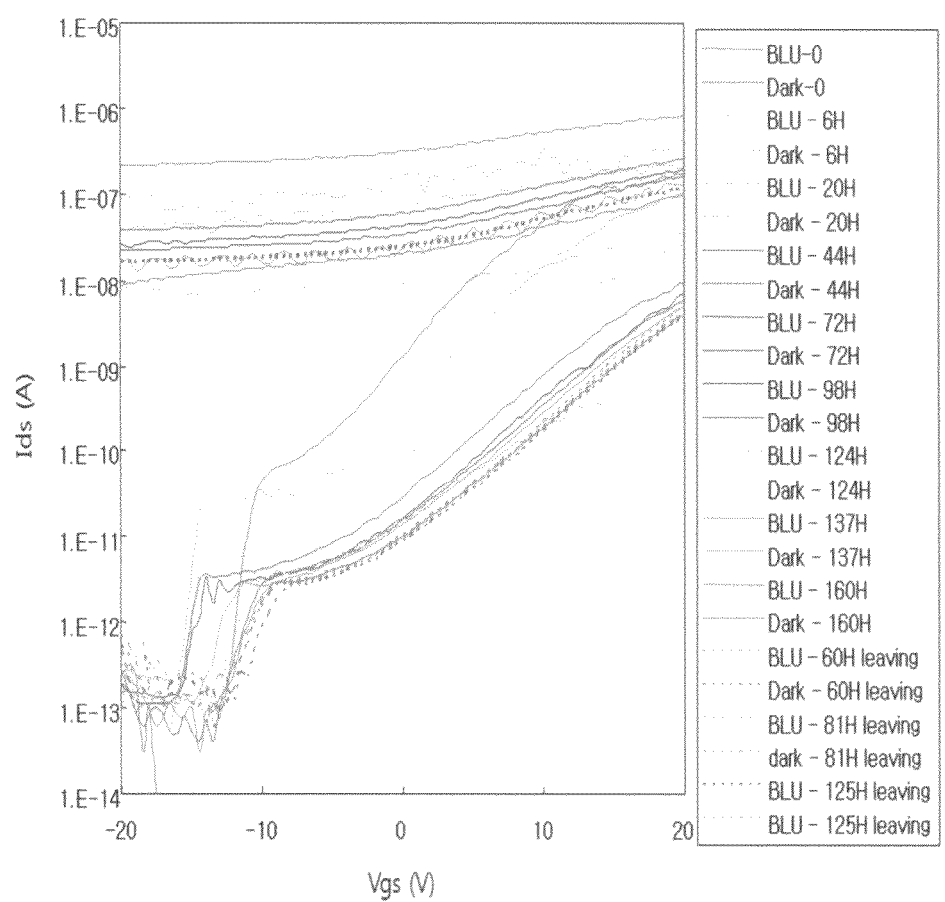
FIG. 1 is a graph showing a photocurrent behavior according to exposure time to light for a conventional visible ray sensor.
Figure 2:
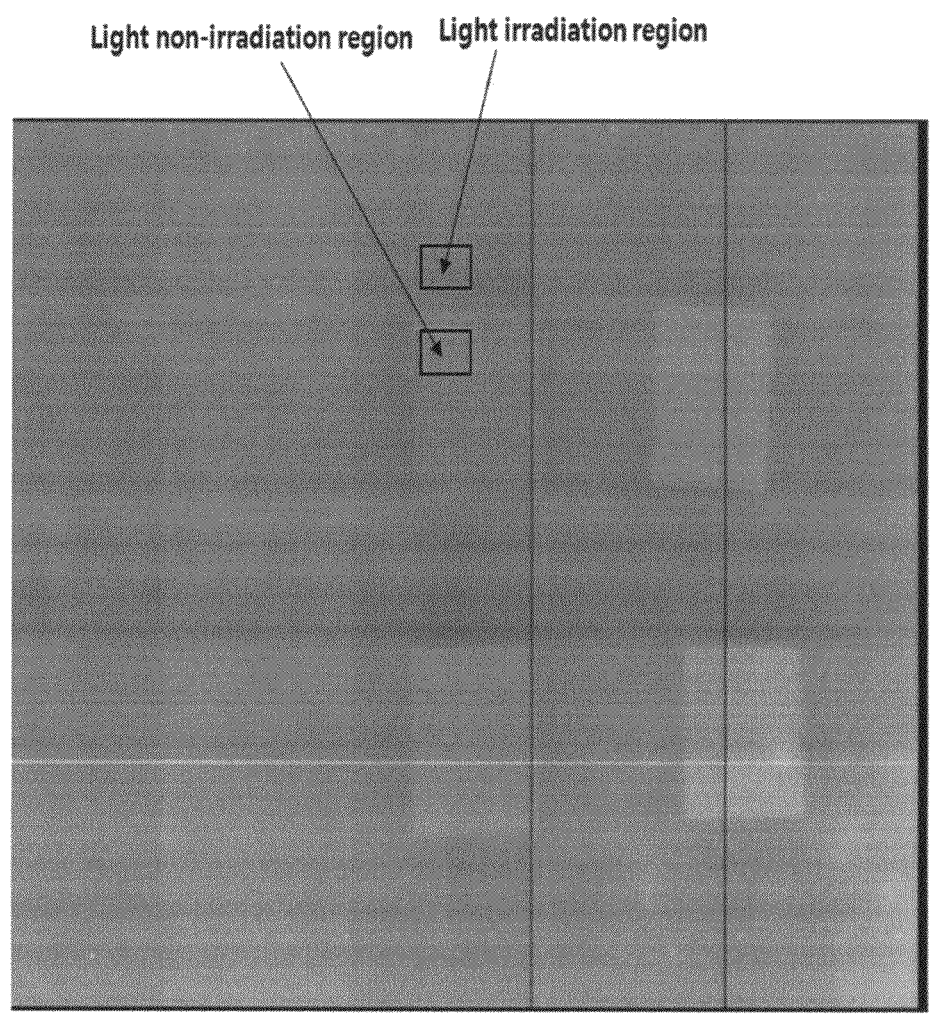
FIG. 2 is a view comparing a region that is exposed to light and a region that is not exposed to light in the conventional visible ray sensor.

The present invention will be described more fully hereinafter with reference to the accompanying drawings, in which exemplary embodiments of the invention are shown. As those skilled in the art would realize, the described embodiments is may be modified in various different ways, all without departing from the spirit or scope of the present invention. This invention may be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary embodiments of the present invention will be described hereinafter.
Firstly, a light sensor according to exemplary embodiments of the present invention will be described with reference to the drawings.

Figure 3:
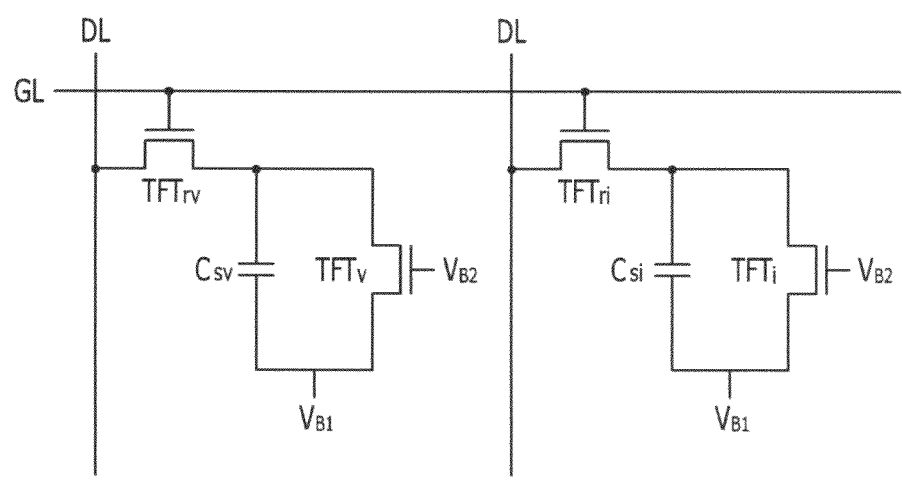
FIG. 3 is a schematic circuit diagram of a light sensor according to exemplary embodiments of the present invention.

FIG. 3 is a schematic circuit diagram of a light sensor according to exemplary embodiments of the present invention.

A light sensor according to exemplary embodiments of the present invention may include a plurality of sensing gate lines GL and sensing data lines DL; a first readout thin film transistor TFTrv and a second readout thin film transistor TFTri connected to the sensing gate lines GL and the sensing data lines DL; a visible ray sensing thin film transistor TFTv connected to the first readout thin film transistor TFTrv; an infrared ray is sensing thin film transistor TFTi connected to the second readout thin film transistor TFTri; a first signal line VB1 for transmitting a first bias voltage; and a second signal line VB2 for transmitting a second bias voltage.

The sensing gate lines GL and the sensing data lines DL may intersect each other thereby defining a plurality of regions. A first portion of the plurality of regions may include the first readout thin film transistor TFTrv and the visible ray sensing thin film transistor TFTv, and may be a portion/region for sensing visible rays. Visible rays may, for example, include electromagnetic radiation having a frequency between 400 to 790 Terahertz (THz). A second portion of the plurality of regions may include the second readout thin film transistor TFTri and the infrared ray sensing thin film transistor TFTi, and may be a portion/region for sensing infrared rays. Infrared rays may, for example, include electromagnetic radiation having a frequency between 300 Gigahertz (GHz) to 400 THz. The regions sensing the visible rays and the regions sensing the infrared rays may be uniformly distributed and may form a matrix. For example, the visible ray sensing regions and the infrared ray sensing regions may be alternately arranged, randomly arranged, or arranged according to a predetermined ratio.

The control terminals of the first readout thin film transistor TFTrv and the second readout thin film transistor TFTri may be connected to the sensing gate line GL. The input terminals of the first readout thin film transistor TFTrv and the second readout thin film transistor TFTri may be connected to the sensing data lines DL. The output terminal of the first readout thin film transistor TFTrv may be connected to the input terminal of the visible ray sensing thin film transistor TFTv, and the output terminal of the second readout thin film transistor TFTri may be connected to the input terminal of the is infrared ray sensing thin film transistor TFTi. The control terminal of the visible ray sensing thin film transistor TFTv may be connected to the second signal line VB2, and the output terminal of the visible ray sensing thin film transistor TFTv may be connected to the first signal line VB1. The control terminal of the infrared ray sensing thin film transistor TFTi may be connected to the second signal line VB2, and the output terminal of the infrared ray sensing thin film transistor TFTi may be connected to the first signal line VB1.

The light sensor may also include a first storage capacitor Csv connected to the first readout thin film transistor TFTrv, and a second storage capacitor Csi connected to the second readout thin film transistor TFTri.

One terminal of the first storage capacitor Csv may be connected to the first signal line VB1, and the other terminal of the first storage capacitor Csv may be connected to the output terminal of the first readout thin film transistor TFTrv. One terminal of the second storage capacitor Csi may be connected to the first signal line VB1, and the other terminal of the second storage capacitor Csi may be connected to the output terminal of the second readout thin film transistor TFTri.

Hereinafter, referring to FIG. 4 and FIG. 5, a visible ray sensor and a light sensor including the same according to exemplary embodiments of the present invention will be described.

Figure 4:
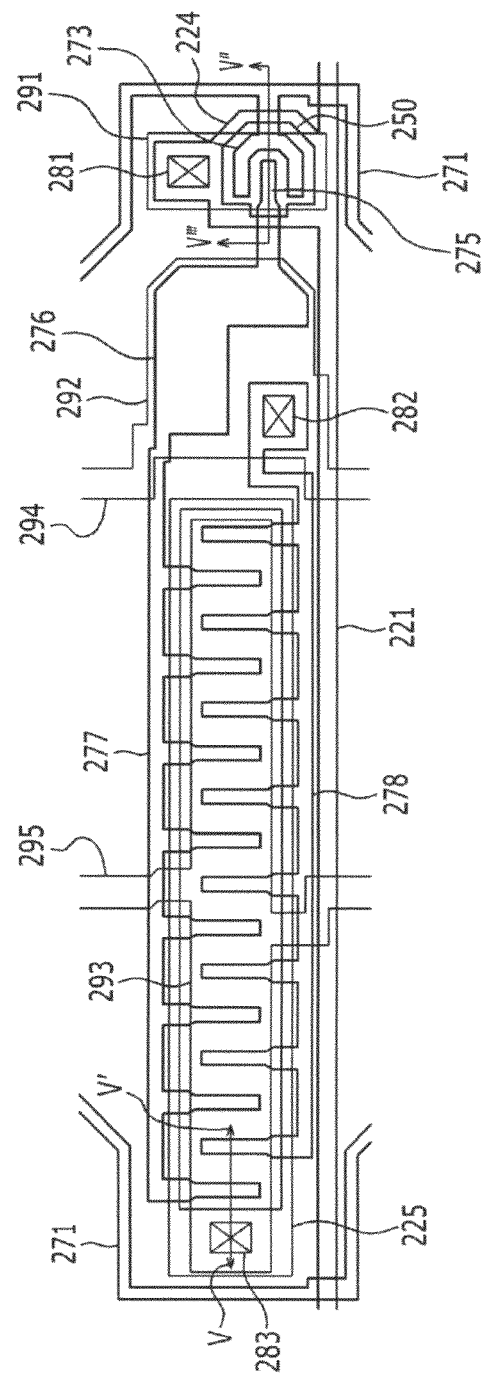
FIG. 4 is a top plan view showing a visible ray sensor according to exemplary embodiments of the present invention.

FIG. 4 is a top plan view showing a visible ray sensor according to exemplary embodiments of the present invention. FIG. 5 is a cross-sectional view taken along the lines V-V' and V"-V'" of the visible ray sensor in FIG. 4 according to the exemplary embodiments of the present invention.

Figure 5:
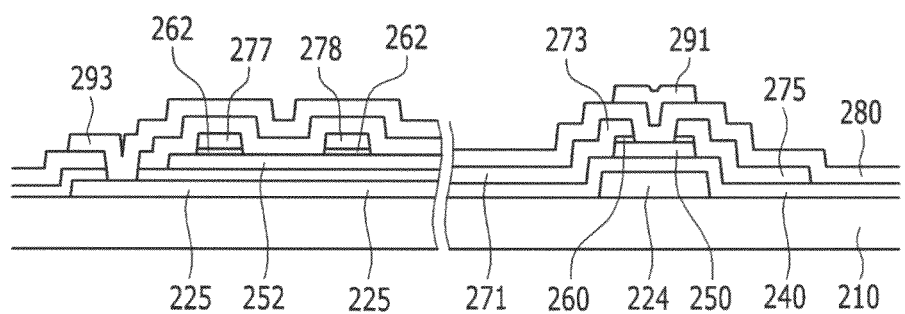
FIG. 5 is a cross-sectional view taken along the lines V-V' and V"-V'" of the visible ray sensor in FIG. 4 according to exemplary embodiments of the invention.

As shown in FIG. 4 and FIG. 5, a visible ray sensor may include a substrate 210 made of transparent glass or plastic; a first light blocking member 225 formed on the substrate 210; a visible ray sensing thin film transistor TFTv (FIG. 3) formed on the first light blocking member 225; a plurality of sensing gate lines 221 and sensing data lines 271 formed on the substrate 210; and a first readout thin film transistor TFTrv (FIG. 3) connected to a sensing gate line 221 and a sensing data line 271.

In some cases, the first light blocking member 225 may be made of a transparent electrode such as a polycrystalline ITO (indium tin oxide) or a polycrystalline IZO (indium zinc oxide). The first light blocking member 225 of the transparent electrode may not transmit a portion of light incident from outside the substrate 210 but may reflect a portion of the incident light, thereby reducing the intensity of the incident light; however, the incident light may still be detected by the visible ray sensor. Accordingly, although light exposure time gradually increases, the photocurrent may be prevented from being decreased.

The visible ray sensing thin film transistor TFTv may include a first gate insulating layer 240 formed on the first light blocking member 225; a first semiconductor layer 252 overlapping the first light blocking member 225 on the first gate insulating layer 240; a first source electrode 277 and a first drain electrode 278 that are formed on the first semiconductor layer 252 and are separated from one another; a second gate insulating layer 280 formed on the first semiconductor layer 252, the first source electrode 277, and the first drain electrode 278; and a first gate electrode 293 formed on the second gate insulating layer 280. A first ohmic contact layer 262 may be further formed between the first semiconductor layer 252 and the first source electrode 277, and between the first semiconductor layer 252 and the first drain electrode 278.

The first gate insulating layer 240 and the second gate insulating layer 280 may include a first contact hole 283 exposing the first light blocking member 225, and the first gate electrode 293 may be connected to the first light blocking member 225 through the first contact hole 283.

The first readout thin film transistor TFTrv may include a second lower gate electrode 224 formed on the substrate 210; the first gate insulating layer 240 formed on the second lower gate electrode 224; a second semiconductor layer 250 overlapping the second lower gate electrode 224 on the first gate insulating layer 240; a second source electrode 273 and a second drain electrode 275 formed on the second semiconductor layer 250 and separated from one another; the second gate insulating layer 280 formed on the second semiconductor layer 250, the second source electrode 273, and the second drain electrode 275; and a second upper gate electrode 291 formed on the second source electrode 273 and the second drain electrode 275. A second ohmic contact layer 260 may be further formed between the second semiconductor layer 250 and the second source electrode 273, and between the second semiconductor layer 250 and the second drain electrode 275.

The second lower gate electrode 224 may protrude from the sensing gate line 221, and the second source electrode 273 may protrude from the sensing data line 271.

In some cases, the first gate insulating layer 240 may be formed to entirely cover the substrate 210, the first light blocking member 225, and the second lower gate electrode 224, and the second gate insulating layer 280 may be formed to entirely cover the substrate 210, the first semiconductor layer 252, the first source electrode 277, the first drain electrode 278, the second semiconductor layer 250, the second source electrode 273, and the second drain electrode 275.

Also, the first gate insulating layer 240 and the second gate insulating layer 280 may include a second contact hole 281 exposing the second lower gate electrode 224. The second upper gate electrode 291 may be connected to the second lower gate electrode 224 through the second contact hole 281.

The visible ray sensor may further include a lower storage electrode 276 connected to the first source electrode 277 and the second drain electrode 275; a first signal line 294 transmitting a first bias voltage; and an upper storage electrode 292 connected to the first signal line 294 and overlapping the lower storage electrode 276.

A third contact hole 282 may be formed at a position in the second gate insulating layer 280 overlapping the first drain electrode 278 and the first signal line 294. The first drain electrode 278 and the first signal line 294 may be connected to each other through the third contact hole 282.

The visible ray sensor may also include a second signal line 295 transmitting a second bias voltage, and the second signal line 295 may be connected to the first gate electrode 293 of the visible ray sensing thin film transistor.

The visible ray sensor may be formed along with the infrared ray sensor, thereby forming a light sensor. As shown in FIG. 3, the infrared ray sensor may include the second readout thin film transistor TFTri (FIG. 3) and the infrared ray sensing thin film transistor TFTi (FIG. 3). The second readout thin film transistor TFTri and the infrared ray sensing thin film transistor TFTi may have a similar configuration as the first readout thin film transistor TFTrv and the visible ray sensing thin film transistor TFTi. However, in contrast to the visible ray sensor, a second light blocking member (not shown) blocking visible rays may be further formed under the infrared ray sensing thin film transistor TFTi is to prevent the passage of visible rays in the infrared ray sensing thin film transistor TFTi. The second light blocking member may be formed of a compound of amorphous germanium (a-Ge) or of amorphous germanium. The compound may allow passage of infrared rays and little or no passage of the visible rays.

The first light blocking member 225 and the second light blocking member may be patterned using the same mask. The layer used to form the first light blocking member 225 and the second light blocking member may be sequentially deposited on the substrate 210 and patterned using a slit mask or a half-tone mask, and thereby the first light blocking member 225 may be formed without an additional process.

Materials and components used to form the electrodes, insulating layers, semiconductor layers, and ohmic layers are generally known in the art, and, accordingly, a detailed description thereof shall not be provided. However, in general, any suitable material and component may be used to form the electrodes, insulating layers, semiconductor layers, and ohmic layers.

Hereinafter, a visible ray sensor and a light sensor including the same according to exemplary embodiments of the present invention will be described with reference to FIG. 6 and FIG. 7.

Figure 6:
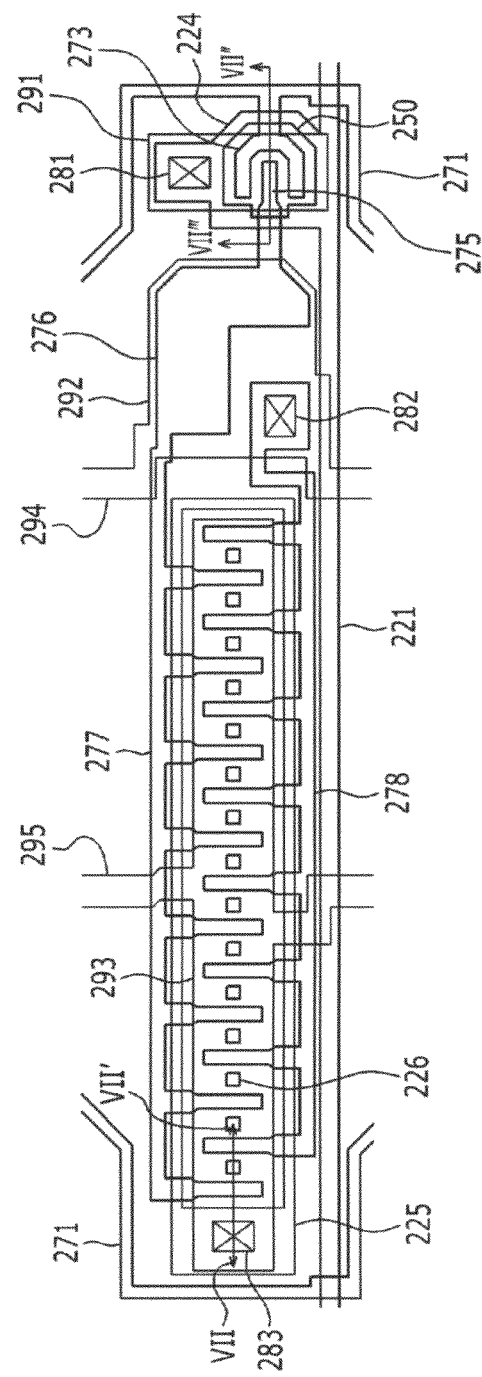
FIG. 6 is a top plan view showing a visible ray sensor according to exemplary embodiments of the present invention.

FIG. 6 is a top plan view showing a visible ray sensor according to exemplary embodiments of the present invention. FIG. 7 is a cross-sectional view taken along the lines VII-VII' and VII"-VII'" of the visible ray sensor in FIG. 6 according to exemplary embodiments of the present invention.

Figure 7:
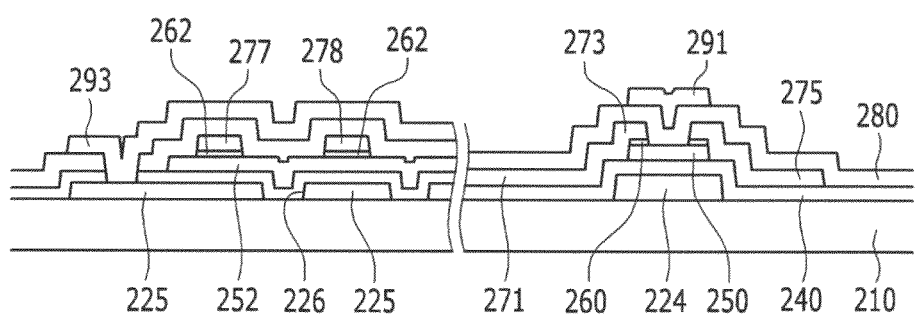
FIG. 7 is a cross-sectional view taken along the lines VII-VII' and VII"-VII'" of the visible ray sensor in FIG. 6 according to exemplary embodiments of the invention.

The configurations of the visible ray sensor and the infrared ray sensor in FIG. 6 and FIG. 7 are similar to the configurations previously described with reference to FIG. 4 and FIG. 5, respectively, therefore a detailed description of the visible ray sensor and the infrared ray sensor in FIG. 6 and FIG. 7 shall be omitted. For example, a visible ray sensing thin film transistor TFTrv and a first readout thin film transistor TFTv in FIG. 6 and FIG. 7 are similar to the configurations previously described with reference to FIG. 4 and FIG. 5, respectively, therefore a detailed description of the visible ray sensing thin film transistor TFTrv and the first readout thin film transistor TFTv in FIG. 6 and FIG. 7 shall be omitted. Differences between the configurations in FIG. 6 and FIG. 7 and configurations in FIG. 4 and FIG. 5, respectively, shall be described in further detail hereinafter.

In some cases, referring to FIG. 6 and FIG. 7, the visible ray sensor may include a substrate 210 made of transparent glass or plastic; a first light blocking member 225 formed on the substrate 210; a visible ray sensing thin film transistor TFTv (FIG. 3) formed on the first light blocking member 225; a plurality of sensing gate lines 221 and sensing data lines 271 formed on the substrate 210; and a first readout thin film transistor TFTrv (FIG. 3) connected to the sensing gate line 221 and to the sensing data line 271.

The first light blocking member 225 may perform the function of a band pass filter and may block visible rays. The first light blocking member 225 may be made of a compound of amorphous germanium (a-Ge) or of amorphous germanium, and the compound may allow passage of infrared rays and little or no passage of the visible rays. In contrast, the first light blocking member 225 described with reference to FIG. 4 and FIG. 5 was a transparent electrode. In some cases, the first light blocking member 225 (as shown in FIG. 6) may have a plurality of openings 226 such that visible rays may only pass through the plurality of openings 226. Accordingly, the visible ray sensing thin film is transistor TFTv may selectively filter radiation and/or visible light, while also preventing photodegradation. In general, the first light blocking member 225 may be made of any suitable material enabling performance of a band pass filtering function.

The first light blocking member 225 and the second light blocking member may be patterned using the same mask. Material capable of blocking visible rays may be deposited on the substrate 210 and pattered such that the first light blocking member 225 may be formed without additional processes.

Hereinafter, a visible ray sensor and a light sensor including the same according to the exemplary embodiments of the present invention will be described with reference to FIG. 8 and FIG. 9.

Figure 8:
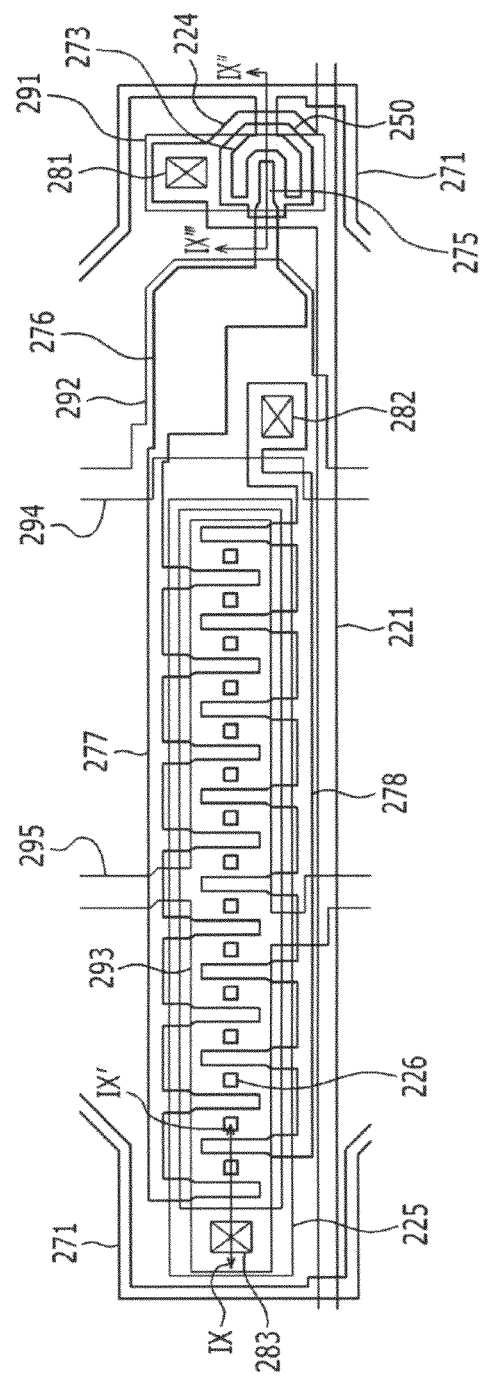
FIG. 8 is a top plan view showing a visible ray sensor according to exemplary embodiments of the present invention.

FIG. 8 is a top plan view showing a visible ray sensor according to exemplary embodiments of the present invention. FIG. 9 is a cross-sectional view taken along the lines IX-IX' and IX"-IX'" of the visible ray sensor in FIG. 8 according to exemplary embodiments of the present invention.

Figure 9:
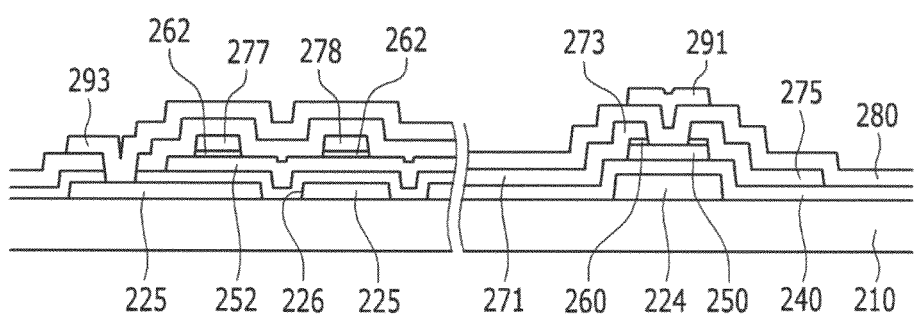
FIG. 9 is a cross-sectional view taken along the lines IX-IX' and IX"-IX'" of the visible ray sensor of FIG. 8 according to exemplary embodiments of the invention.

The configurations of the visible ray sensor and the infrared ray sensor in FIG. 8 and FIG. 9 are similar to the configurations previously described with reference to FIG. 4 and FIG. 5, respectively, therefore a detailed description of the visible ray sensor and the infrared ray sensor in FIG. 8 and FIG. 9 shall be omitted. For example, a visible ray sensing thin film transistor TFTrv and a first readout thin film transistor TFTv in FIG. 8 and FIG. 9 are similar to the configurations previously described with reference to FIG. 4 and FIG. 5, respectively, therefore a detailed description of the visible ray sensing thin film transistor TFTrv and the first readout thin film transistor TFTv in FIG. 8 and FIG. 9 shall be omitted. Differences between the configurations in FIG. 8 and FIG. 9 and is configurations in FIG. 4 and FIG. 5, respectively, shall be described in further detail hereinafter.

In some cases, referring to FIG. 8 and FIG. 9, the visible ray sensor may include a substrate 210 made of transparent glass or plastic; a first light blocking member 225 formed on the substrate 210; a visible ray sensing thin film transistor TFTv (FIG. 3) formed on the first light blocking member 225; a plurality of sensing gate lines 221 and sensing data lines 271 formed on the substrate 210; and a first readout thin film transistor TFTrv (FIG. 3) connected to the sensing gate line 221 and to the sensing data line 271.

The first light blocking member 225 may be made of an opaque metal forming the sensing gate lines 221 and the sensing data lines 271 such that the light may be effectively blocked. In contrast, the first light blocking member 225 described with reference to FIG. 4 and FIG. 5 was a transparent electrode. In some cases, as shown in FIG. 8, the first light blocking member 225 may have a plurality of openings 226 such that visible rays may only pass through the plurality of openings 226. Accordingly, the visible ray sensing thin film transistor TFTv may selectively filter radiation and/or visible light, while also being capable of preventing photodegradation. In general, the first light blocking member 225 may be made of any suitable material enabling performance of a band pass filtering function.

The first light blocking member 225 may be made of the same material as the second lower gate electrode 224 of the first readout thin film transistor. Accordingly, the first light blocking member 225 and the second lower gate electrode 224 may be pattered with the same mask. The opaque metal may be deposited and patterned on the substrate 210 to form the first light blocking member 225 without additional processes.

Next, an aspect of a photocurrent being changed according to the time that a visible ray sensor is exposed to light will be described for a conventional visible ray sensor and a visible ray sensor of the present invention.

Figure 10:
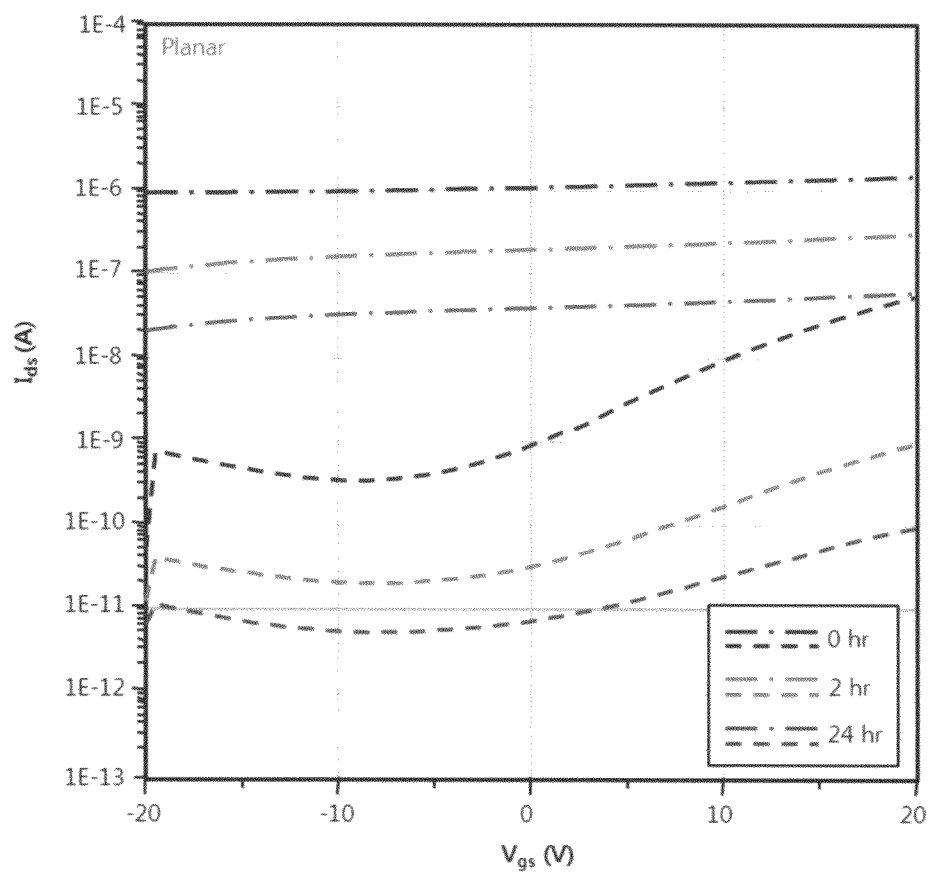
FIG. 10 is a graph showing a photocurrent according to exposure time to light in a conventional visible ray sensor.
Figure 11:
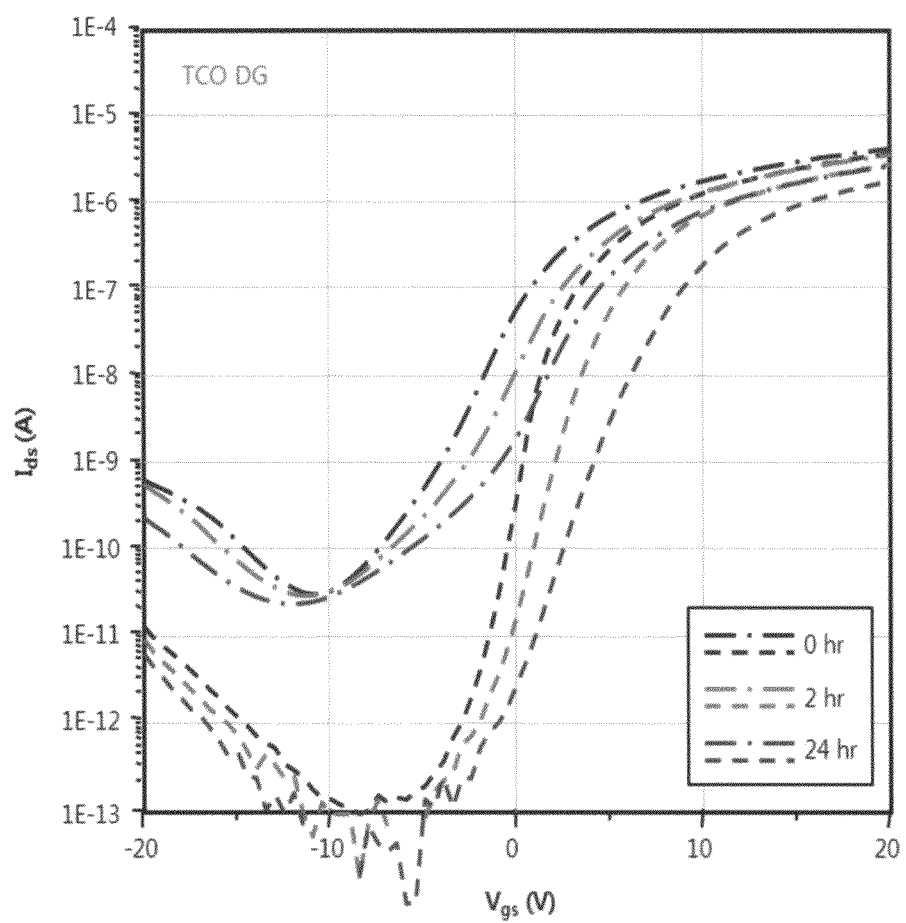
FIG. 11 is a graph showing a photocurrent according to exposure time to light in the visible ray sensor of FIG. 4 and FIG. 5 according to exemplary embodiments of the present invention.
Figure 12:
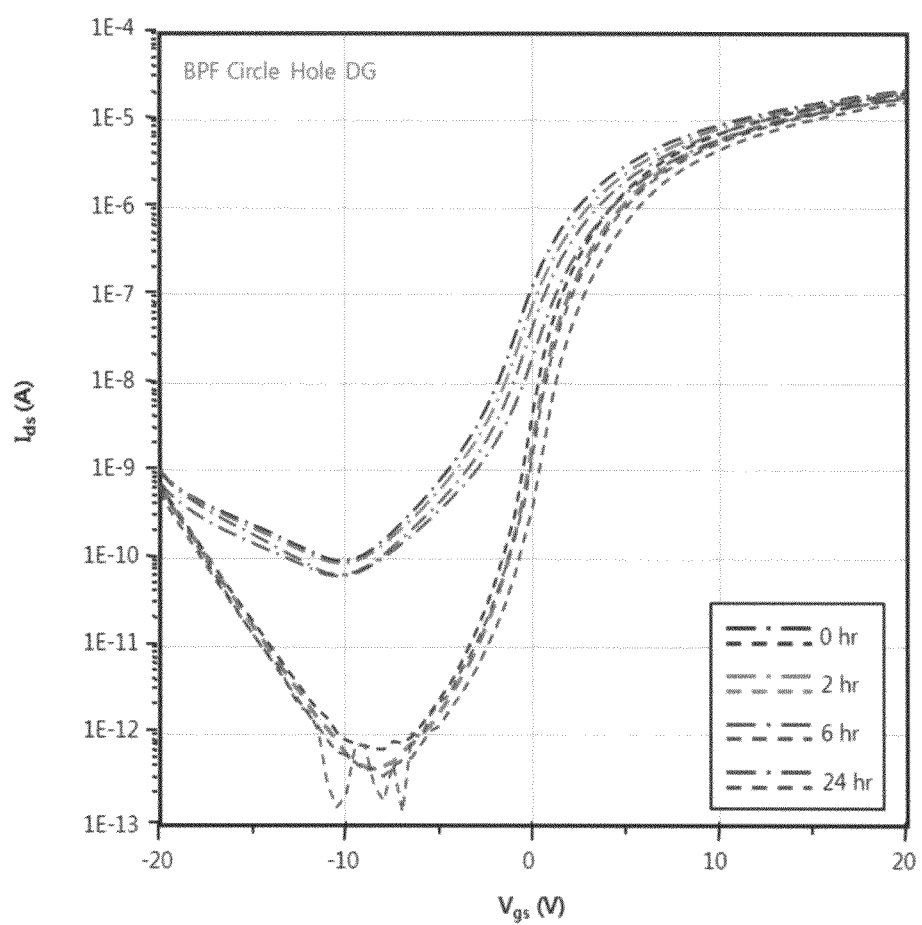
FIG. 12 is a graph showing a photocurrent according to exposure time to light in the visible ray sensor of FIG. 8 and FIG. 9 according to exemplary embodiments of the present invention.

FIG. 10 is a graph illustrating properties of a photocurrent according to exposure time to light in a conventional visible ray sensor. FIG. 11 is a graph illustrating properties of a photocurrent according to exposure time to light in the visible ray sensor described with reference to FIG. 4 and FIG. 5. FIG. 12 is a graph illustrating properties of a photocurrent according to exposure time to light according to the visible ray sensors described with reference to FIG. 8 and FIG. 9.

Referring to FIG. 10, in the case of a conventional visible ray sensor, as the exposure time to light is increased, the photocurrent gradually decreases. Accordingly, the electrical conductivity decreases such that photosensitivity of the light sensor deteriorates.

Referring to FIG. 11, in the visible ray sensor described with reference to FIG. 4 and FIG. 5, the first light blocking member 225 is made of a transparent electrode and is formed under the visible ray sensing thin film transistor TFTv such that a portion of the light incident to the visible ray sensing thin film transistor TFTv may be blocked. Accordingly, photodegradation that is generated in the conventional visible ray sensor may be prevented.

Referring to FIG. 12, in the visible ray sensors described with reference to FIG. 8 and FIG. 9, the visible light blocking filter or the first light blocking member 225 is made of an opaque electrode and is formed under the visible ray sensing thin film transistor TFTv such that photodegradation may be further effectively prevented compared to the visible ray sensor described with reference to FIG. 4 and FIG. 5. To prevent visible light is from not being sensed due to complete blockage of the visible light, the first light blocking member 225 may have a plurality of openings such that a portion of visible light may be incident to the visible ray sensing thin film transistor TFTv. The size of the openings may be controlled such that the amount of photocurrent generated in the visible ray sensor and the infrared ray sensor may be controlled. For instance, the opening sizes may be controlled so that the photocurrents generated by the visible ray sensor and the infrared ray sensor are the same.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents. Furthermore, it should be understood that exemplary embodiments of the present invention are not limited to LCDs and may be utilized in other suitable devices as well.

What is claimed is:
1. A visible ray sensor, comprising:
a substrate;
a light blocking member disposed on the substrate; and
a visible ray sensing thin film transistor disposed on the light blocking member and comprising a first gate insulating layer and a first gate electrode,
wherein the first gate insulating layer is disposed on the light blocking member, which is under the first gate insulating layer, and comprises a first contact hole that exposes the light blocking member, wherein the first gate insulation layer is electrically connected to a bottom surface of a first semiconductor layer of the thin film transistor,
wherein source and drain electrodes are electrically connected to a portion of the top surface of the semiconductor layer, respectively,
wherein the first gate electrode is electrically connected to a top surface of a second gate insulation layer at least at the central portion of the first semiconductor layer between the source and drain electrodes,
wherein a portion of a bottom surface of the second gate insulation layer is electrically connected to a central portion of the top surface of the first semiconductor layer between the source and drain electrodes, and the second gate insulation layer comprises a second contact hole aligned to the first contact hole such that the light blocking member is exposed, and
wherein the first gate electrode is disposed on the first gate insulating layer and directly connected to the light blocking member through the first and second contact holes.

2. The visible ray sensor of claim 1, wherein
the light blocking member comprises a transparent electrode.
3. The visible ray sensor of claim 1, wherein
the transparent electrode comprises polycrystalline indium tin oxide or polycrystalline indium zinc oxide.
4. The visible ray sensor of claim 1, wherein
the light blocking member comprises a plurality of openings.
5. The visible ray sensor of claim 4, wherein
the light blocking member comprises a band pass filter.
6. The visible ray sensor of claim 5, wherein
the band pass filter is configured to block visible rays.
7. The visible ray sensor of claim 6, wherein
the light blocking member comprises a material comprising amorphous germanium or a compound of amorphous germanium.
8. The visible ray sensor of claim 4, wherein
the light blocking member comprises an opaque metal.

* * * * *